United States Patent
Sasaki

(10) Patent No.: US 9,605,358 B2
(45) Date of Patent: *Mar. 28, 2017

(54) SILICON CARBIDE SUBSTRATE, SILICON CARBIDE INGOT, AND METHODS FOR MANUFACTURING SILICON CARBIDE SUBSTRATE AND SILICON CARBIDE INGOT

(71) Applicant: SUMITOMO ELECTRIC INDUSTRIES, LTD., Osaka-shi, Osaka (JP)

(72) Inventor: Makoto Sasaki, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/213,836

(22) Filed: Jul. 19, 2016

(65) Prior Publication Data

US 2016/0326669 A1 Nov. 10, 2016

Related U.S. Application Data

(63) Continuation of application No. 14/198,642, filed on Mar. 6, 2014, now Pat. No. 9,422,639.

(51) Int. Cl.
*H01L 29/16* (2006.01)
*C30B 29/36* (2006.01)
(Continued)

(52) U.S. Cl.
CPC ............ *C30B 29/36* (2013.01); *C30B 23/066* (2013.01); *C30B 33/00* (2013.01)

(58) Field of Classification Search
CPC ....... C30B 23/025; C30B 23/06; C30B 29/36; H01L 29/1608
(Continued)

(56) References Cited

U.S. PATENT DOCUMENTS

| 6,451,112 B1 | 9/2002 | Hara et al. |
| 2005/0211156 A1* | 9/2005 | Gunjishima ............ C30B 23/00 117/2 |

(Continued)

FOREIGN PATENT DOCUMENTS

| JP | H11-278985 A | 10/1999 |
| JP | 2001-114598 A | 4/2001 |

(Continued)

OTHER PUBLICATIONS

Notification of Grounds of Rejection issued Apr. 26, 2016 in Japanese Patent Application No. 2012-254307 (3 pages) with an English Translation.

*Primary Examiner* — Ori Nadav
*Assistant Examiner* — Vernon P Webb
(74) *Attorney, Agent, or Firm* — Drinker Biddle & Reath LLP

(57) ABSTRACT

A silicon carbide substrate, a silicon carbide ingot, and methods for manufacturing the silicon carbide substrate and the silicon carbide ingot capable of improving a yield of a semiconductor device having silicon carbide as constituent material are provided. In the silicon carbide substrate, patterns formed by crossing straight lines extending along the <11-20> direction and being observable by means of an X-ray topography are present at a number density of less than or equal to 0.1 patterns/cm$^2$ on one main surface. As described above, in the silicon carbide substrate, the number density of the crossing patterns present on the main surface is reduced to less than or equal to 0.1 patterns/cm$^2$. Therefore, when the semiconductor device is manufactured with use of a silicon carbide substrate, a lowering of a yield caused by the crossing patterns can be suppressed.

4 Claims, 4 Drawing Sheets

(51) Int. Cl.
*C30B 33/00* (2006.01)
*C30B 23/06* (2006.01)

(58) Field of Classification Search
USPC .............. 257/77, 79; 125/30.01; 117/84
See application file for complete search history.

(56) References Cited

U.S. PATENT DOCUMENTS

2011/0206929 A1  8/2011  Nakabayashi et al.
2013/0095294 A1  4/2013  Sasaki et al.

FOREIGN PATENT DOCUMENTS

| JP | 2004-323348 A | 11/2004 |
| JP | 2007-119273 A | 5/2007 |
| JP | 2010-095397 A | 4/2010 |
| JP | 2010-514648 A | 5/2010 |
| JP | 2010-254521 A | 11/2010 |
| WO | WO-2008-033994 A1 | 3/2008 |

* cited by examiner

SILICON CARBIDE SUBSTRATE, SILICON CARBIDE INGOT, AND METHODS FOR MANUFACTURING SILICON CARBIDE SUBSTRATE AND SILICON CARBIDE INGOT

CROSS-REFERENCE TO RELATED APPLICATIONS

This application is a continuation of U.S. application Ser. No. 14/198,642, filed Mar. 6, 2014, the entire contents of which are hereby incorporated by reference.

BACKGROUND OF THE INVENTION

Field of the Invention

The present invention relates to a silicon carbide substrate, a silicon carbide ingot, and methods for manufacturing the silicon carbide substrate and the silicon carbide ingot, and more particularly to a silicon carbide substrate and a silicon carbide ingot capable of improving a yield of a semiconductor device having silicon carbide as constituent material, and methods for manufacturing the same.

Description of the Background Art

Conventionally, a study has been conducted on silicon carbide as next-generation semiconductor material which replaces silicon. As a method for manufacturing a substrate made of silicon carbide, there has been a known method of, for example, growing a silicon carbide layer made of single-crystal silicon carbide on a seed substrate through a sublimation method to form a silicon carbide ingot and slicing the silicon carbide ingot. For example, Japanese Patent Laying-Open No. 2004-323348 (PTD 1) discloses a method of preparing a seed substrate with a growth plane which is a (0001) plane (so-called c-plane) or a plane having a predetermined off angle with respect to the c-plane, and growing a silicon carbide layer on the growth plane. Further, in the silicon carbide ingot formed through such a method, a region with a crystal growth through a spiral growth (so-called a facet region) and a region with a crystal growth through a step-flow growth along steps of a crystal are formed.

There has been a problem that it would be difficult to sufficiently improve a yield when a semiconductor device is manufactured with use of the silicon carbide substrate obtained by the conventional method of forming a silicon carbide ingot and slicing the silicon carbide ingot.

SUMMARY OF THE INVENTION

The present invention was achieved in view of the problem described above, and its object is to provide a silicon carbide substrate and a silicon carbide ingot capable of improving a yield of a semiconductor device having silicon carbide as constituent material, and methods for manufacturing the same.

In the silicon carbide substrate according to the present invention, patterns formed by crossing straight lines extending along the <11-20> direction and being observable by means of an X-ray topography are present at a number density of less than or equal to 0.1 patterns/cm² on one main surface.

The present inventor conducted consideration in detail on the cause of difficulty in sufficiently improving a yield in the case where a semiconductor device is manufactured with use of a silicon carbide substrate manufactured by the conventional method. As a result, the inventor found out that patterns formed by crossing straight lines extending along the <11-20> direction are present on one main surface of the silicon carbide substrate and that there is a correlation between presence of the patterns and a yield obtained in the manufacture of the semiconductor device, and then the inventor conceived of the present invention.

In the silicon carbide substrate according to the present invention, the number density of the patterns on one main surface is reduced to less than or equal to 0.1 patterns/cm². At the center of the patterns, a defect such as dislocation is present. Therefore, when a semiconductor device is manufactured with use of the silicon carbide substrate, a lowering of a yield caused by the patterns can be suppressed. Thus, with the silicon carbide substrate according to the present invention, a silicon carbide substrate can be provided which can improve a yield of a semiconductor device having silicon carbide as constituent material. Further, the silicon carbide substrate according to the present invention may be a silicon carbide substrate which can be obtained by slicing a silicon carbide ingot according to the present invention which will be described later.

Further, the straight line constituting the pattern is not limited to those observable as a continuous line but may also include a plurality of line segments which are separated one another and lined up discontinuously so as to constitute an imaginary straight line.

In a silicon carbide ingot according to the present invention, patterns formed by crossing straight lines extending along the <11-20> direction is present at a number density of less than or equal to 0.1 patterns/cm² on one main surface.

In the silicon carbide ingot according to the present invention, the number density of the patterns on one main surface is reduced to less than or equal to 0.1 patterns/cm². At the center of the patterns, a defect such as dislocation is present. Therefore, when a semiconductor device is manufactured with use of the silicon carbide substrate obtained by slicing the silicon carbide ingot, a lowering of a yield caused by the patterns can be suppressed. Thus, with the silicon carbide ingot according to the present invention, a silicon carbide ingot can be provided which can improve a yield of a semiconductor device having silicon carbide as constituent material.

A polytype of the silicon carbide ingot may be 4H. The patterns readily occur in a 4H-polytype silicon carbide ingot. Therefore, when the polytype is 4H, the silicon carbide ingot according to the present invention capable of reducing the number density of the patterns can be employed suitably.

A method for manufacturing a silicon carbide ingot according to one aspect of the present invention includes the steps of preparing a seed substrate made of single-crystal silicon carbide, arranging the seed substrate in a growth container so that one surface of the seed substrate is in contact with an upper face of the growth container, raising a temperature of the growth container after the seed substrate is arranged, and growing a silicon carbide layer on the other surface opposite to the one surface of the seed substrate after the temperature of the growth container is raised. In the step of raising a temperature of the growth container, when it is provided that a temperature at the upper face is $T_1$, and a temperature at a bottom face of the growth container facing the upper face is $T_2$, and a distance between the upper face and the bottom face in a direction from the bottom face toward the upper face is L, a state with a value of $(T_2-T_1)/L$ smaller than 1 is maintained.

With the method for manufacturing a silicon carbide ingot according to one aspect of the present invention, the temperature of the growth container is raised in the state where a temperature distribution along the direction from the bottom face toward the upper face is uniform. Accordingly, a thermal stress exerted to the other surface of the seed substrate is reduced, so that occurrence of a defect in the silicon carbide layer which grows on the other surface can be suppressed. Consequently, occurrence of the patterns formed by crossing lines extending along the <11-20> direction can be suppressed on the surface of the silicon carbide layer (the surface on a side opposite to the seed substrate side). Thus, with the method for manufacturing a silicon carbide ingot according to one aspect of the present invention, a silicon carbide ingot capable of improving a yield of a semiconductor device having silicon carbide as constituent material can be manufactured.

In the method for manufacturing a silicon carbide ingot according to one aspect, a seed substrate having a micropipe density of less than or equal to $10/cm^2$ may be prepared in the step of preparing a seed substrate. Accordingly, occurrence of a threading dislocation which causes occurrence of the patterns in the silicon carbide layer can be suppressed. Consequently, occurrence of the patterns on the surface of the silicon carbide layer can be suppressed more effectively.

In the method for manufacturing a silicon carbide ingot, a temperature gradient in a width direction viewed from a growth direction of the silicon carbide layer may be less than or equal to 10° C./cm in the step of growing a silicon carbide layer. Accordingly, occurrence of a defect threading in the growth direction in the silicon carbide layer can be suppressed. Consequently, occurrence of the patterns on the surface of the silicon carbide layer can be suppressed more effectively.

A method for manufacturing a silicon carbide ingot according to another aspect of the present invention includes the steps of preparing a seed substrate made of single-crystal silicon carbide and growing a silicon carbide layer on a surface of the seed substrate. The seed substrate having a micropipe density of less than or equal to $10/cm^2$ is prepared in the step of preparing a seed substrate.

With the method for manufacturing a silicon carbide ingot according to another aspect of the present invention, a silicon carbide layer is grown on a seed substrate having a reduced micropipe density. Therefore, occurrence of the threading dislocation which causes occurrence of the patterns in the silicon carbide layer can be suppressed. Accordingly, occurrence of the patterns on a surface of the silicon carbide layer (a surface on a side opposite to the seed substrate) can be suppressed. Thus, according to the method for manufacturing a silicon carbide ingot according to another aspect of the present invention, a silicon carbide ingot capable of improving a yield of a semiconductor device having silicon carbide as constituent material can be manufactured.

In the method for manufacturing a silicon carbide ingot according to another aspect, a temperature gradient in a width direction viewed from a growth direction of the silicon carbide layer may be set less than or equal to 10° C./cm in the step of growing a silicon carbide layer. Accordingly, occurrence of a defect threading in the growth direction in the silicon carbide layer can be suppressed. Consequently, occurrence of the patterns on the surface of the silicon carbide layer can be suppressed more effectively.

A method for manufacturing a silicon carbide substrate according to the present invention includes the steps of preparing a silicon carbide ingot and obtaining a silicon carbide substrate by slicing the silicon carbide ingot. In the step of preparing a silicon carbide ingot, a silicon carbide ingot is prepared which is manufactured by the method for manufacturing a silicon carbide ingot according to the present invention capable of suppressing occurrence of the pattern. Therefore, occurrence of the patterns is suppressed on the main surface of the silicon carbide substrate obtained by slicing the silicon carbide ingot. Thus, according to the method for manufacturing a silicon carbide substrate, a silicon carbide substrate capable of improving a yield of a semiconductor device having silicon carbide as constituent material can be manufactured.

As is apparent from the description above, with the silicon carbide substrate and the silicon carbide ingot according to the present invention, a silicon carbide substrate and a silicon carbide ingot capable of improving a yield of a semiconductor device having silicon carbide as constituent material can be provided. Further, with the methods for manufacturing a silicon carbide substrate and a silicon carbide ingot according to the present invention, a silicon carbide substrate and a silicon carbide ingot capable of improving a yield of a semiconductor device having silicon carbide as constituent material can be manufactured.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
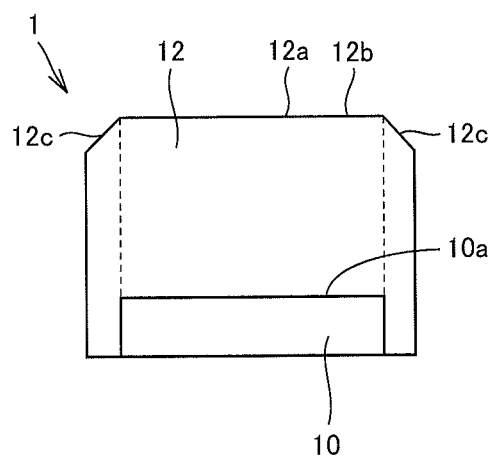
FIG. 1 is a side view schematically representing a silicon carbide ingot.

In the following, the embodiment of the present invention will be described with reference to the drawings. In the drawings below, the same or corresponding elements have the same reference numerals allotted, and description of these elements will not be repeated. In the description, an individual orientation is indicated by [ ], a group orientation is indicated by < >, an individual plane is indicated by ( ), and a group plane is indicated by { }. Further, the "–" (bar) is generally added on the number of a negative index in the crystallographic description. However, in the present description, an negative sign is given ahead of the number.

Firstly, a silicon carbide ingot and a silicon carbide substrate according to one embodiment of the present invention will be described. Referring to FIG. 1, a silicon carbide ingot 1 according to the present embodiment includes a seed substrate 10 made of single-crystal silicon carbide and a silicon carbide layer 12 formed on a surface 10a of seed substrate 10. Surface 10a of seed substrate 10 has an off angle less than or equal to 1°, preferably less than or equal to 0.5°, more preferably 0°, with respect to a (0001) plane. A polytype of silicon carbide ingot 1 is, for example, 4H.

At a surface 12a on a side opposite to seed substrate 10 in silicon carbide layer 12, a facet face 12b including a central portion of an ingot and a non-facet face 12c present in an outer peripheral portion are formed. A region under facet face 12b in silicon carbide layer 12 is a region with a crystal growth through a spiral growth centering on a spiral dislocation. On the other hand, a region under non-facet face 12c is a region with a crystal growth through a step-flow growth along steps of a crystal.

Figure 2:
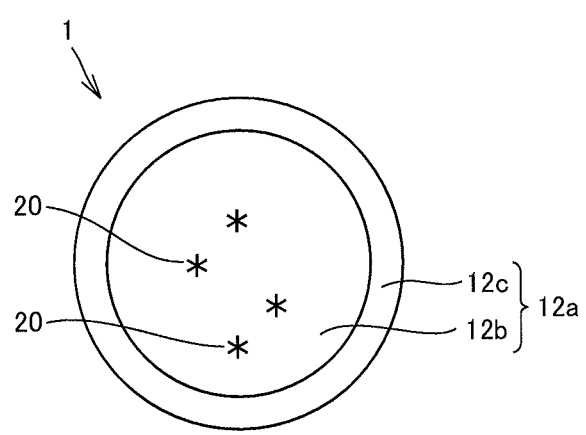
FIG. 2 is a top view schematically representing a silicon carbide ingot.

Referring to FIG. 2, in facet face 12b within one surface 12a of silicon carbide ingot 1 (silicon carbide layer 12), crossing patterns 20 are present which are formed by crossing a plurality of straight lines along the <11-20> direction one another. The outermost peripheral portion of the region having crossing patterns 20 therein constitutes a hexagonal shape, more specifically a regular hexagonal shape. Further, each of the plurality of straight lines constituting crossing patterns 20 is an orthogonal line of the hexagon.

A number density of crossing patterns 20 in surface 12a of silicon carbide layer 12 is 0.1 patterns/cm$^2$, preferably 0 patterns/cm$^2$ (the state where no crossing pattern 20 is present). A spiral dislocation and a micropipe are present in a center portion of crossing patterns 20 (a cross point of the plurality of straight lines), and crossing patterns 20 are visually observable. Further, although crossing patterns 20 can be readily observed when the polytype of the ingot is 4H, it is difficult to observe when the polytype is other than 4H (for example, a 6H type).

Figure 3:
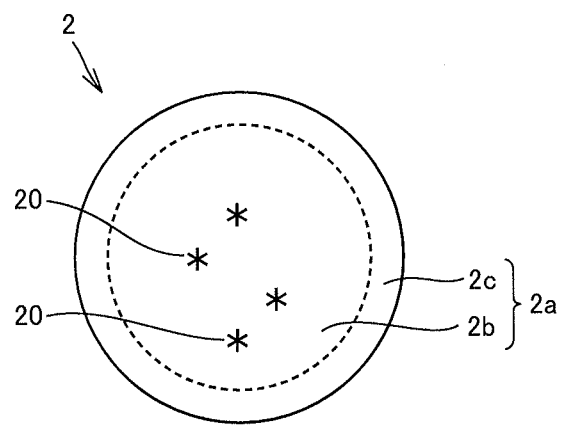
FIG. 3 is a top view schematically representing a silicon carbide substrate.

Next, a silicon carbide substrate according to the present embodiment will be described. Referring to FIG. 3, a silicon carbide substrate 2 according to the present embodiment can be obtained, for example, by slicing silicon carbide ingot 1 according to the present embodiment described above.

Figure 4:
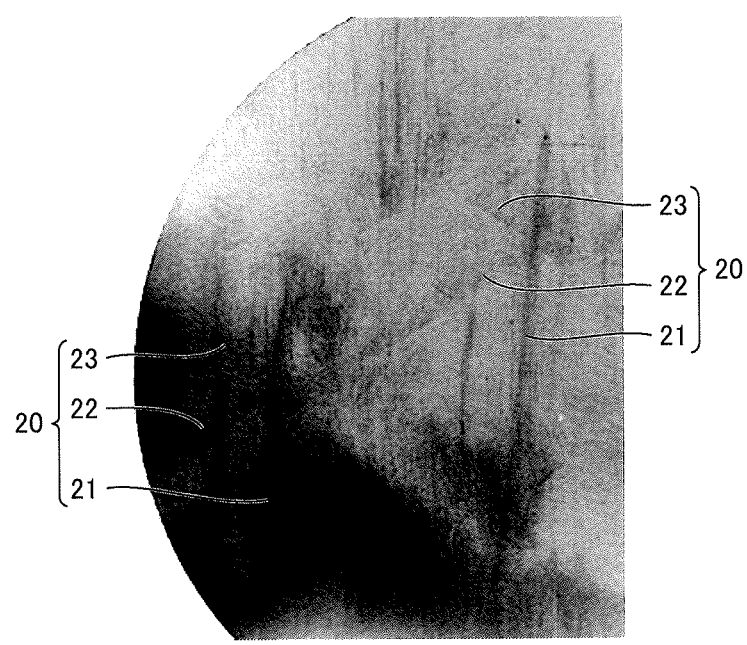
FIG. 4 is a photograph representing observation of crossing patterns which are present on a main surface of a silicon carbide substrate by means of an X-ray topography.

At one main surface 2a of silicon carbide substrate 2, a facet face 2b including a substrate central portion and a non-facet face 2c are formed. Further, referring to FIGS. 3 and 4, in facet face 2b within main surface 2a, similarly to the case of silicon carbide ingot 1, crossing patterns 20 formed by crossing straight lines 21, 22, 23 extending along <11-20> one another are present. A number density of crossing patterns 20 in main surface 2a is less than or equal to 0.1 patterns/cm$^2$, preferably 0 patterns/cm$^2$ (the state where no crossing pattern 20 is present). Further, it is difficult to visually observe crossing patterns 20 in silicon carbide substrate 2, and crossing patterns 20 can be observed by means of an X-ray topography as shown in FIG. 4.

As described above, in silicon carbide ingot 1 according to the present embodiment, a number density of crossing patterns 20 present in surface 12a (facet face 12b) of silicon carbide layer 12 is reduced to less than or equal to 0.1 patterns/cm$^2$. Further, also in silicon carbide substrate 2 obtained by slicing silicon carbide ingot 1, a number density of crossing patterns 20 present on main surface 2a is similarly reduced to less than or equal to 0.1 patterns/cm$^2$. Since crossing pattern 20 is a crystal grain boundary of silicon carbide, a yield is lowered when a semiconductor device such as a MOSFET (Metal Oxide Semiconductor Field Effect Transistor) is manufactured with use of a silicon carbide substrate having a large number of crossing patterns 20 present. On the other hand, since the number of occurrence of crossing patterns 20 is reduced in silicon carbide ingot 1 and silicon carbide substrate 2 obtained by slicing silicon carbide ingot 1, a lowering of a yield can be suppressed when a semiconductor device is manufactured with use of silicon carbide substrate 2. Thus, with silicon carbide ingot 1 and silicon carbide substrate 2 according to the present embodiment, a yield of a semiconductor device having silicon carbide as constituent material can be improved.

Next, methods for manufacturing a silicon carbide ingot and a silicon carbide substrate according to the present embodiment will be described. In the methods for manufacturing a silicon carbide ingot and a silicon carbide substrate according to the present embodiment, silicon carbide ingot 1 and silicon carbide substrate 2 according to the present embodiment are manufactured respectively.

Figure 5:
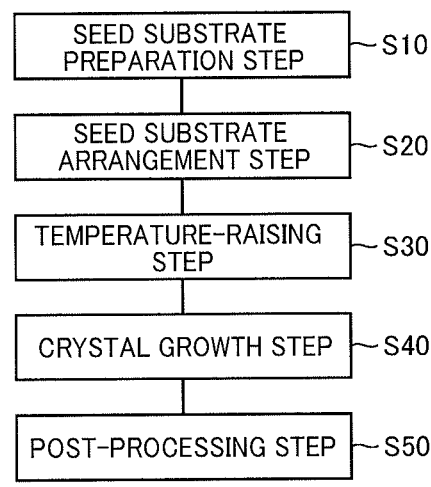
FIG. 5 is a flowchart schematically representing a method for manufacturing a silicon carbide ingot.
Figure 7:
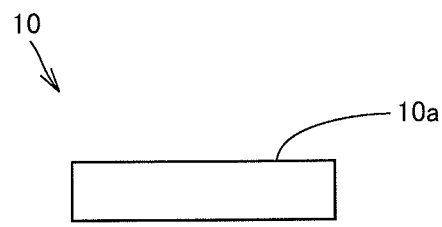
FIG. 7 is a schematic view for description of a method for manufacturing a silicon carbide ingot.

Firstly, a method for manufacturing a silicon carbide ingot according to the present embodiment will be described. Referring to FIG. 5, in the method for manufacturing a silicon carbide ingot according to the present embodiment, a seed substrate preparation step is firstly performed as a step (S10). In this step (S10), referring to FIG. 7, seed substrate 10 made of single-crystal silicon carbide is prepared. Surface 10a of seed substrate 10 preferably has an off angle of less than or equal to 10°, more preferably less than or equal to 5°, with respect to the (0001) plane. When the off angle is 0°, surface 10a of seed substrate 10 is substantially the (0001) plane.

In this step (S10), seed substrate 10 having a micropipe density (MPD) of less than or equal to 10/cm$^2$ is prepared. The micropipe density (MPD) of seed substrate 10 can be calculated as follows. Firstly, seed substrate 10 is immersed in heated and melted KOH, and the number of pits are counted by observing a surface of seed substrate 10 with use of a Normarski differential interference microscope. Then, the number of pits per unit area is calculated based on a area of the observed region and the counted number of pits, so that the micropipe density (MP) is obtained.

Further, in this step (S10), it is preferable that seed substrate 10 is prepared which has the micropipe density (MPD) of less than or equal to 5/cm$^2$ confirmed in the case of performing mirror polishing and thereafter observing with use of a polarizing microscope (cross nicol). Further, the micropipe density (MPD) is preferably less than or equal to 2/cm$^2$, more preferably 0/cm$^2$.

Figure 8:
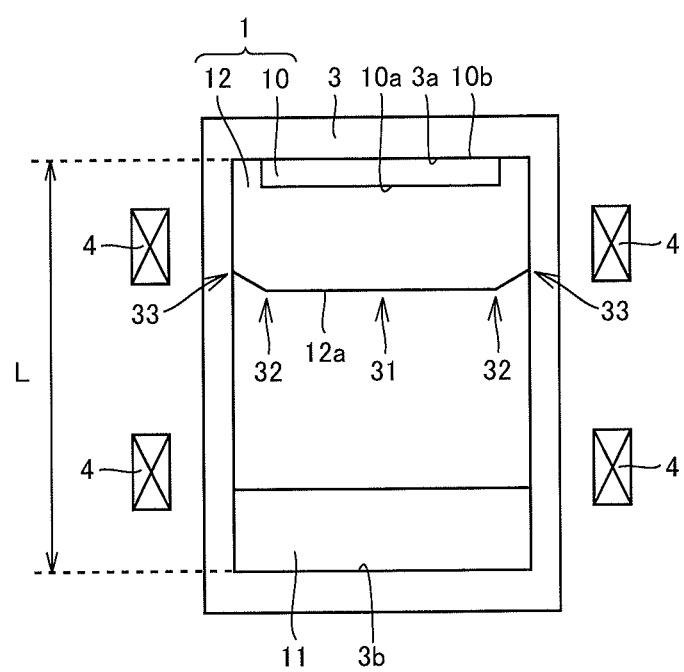
FIG. 8 is a schematic view for description of a method for manufacturing a silicon carbide ingot.

Next, as a step (S20), a seed substrate arrangement step is performed. In this step (S20), referring to FIG. 8, seed substrate 10 is arranged in a crucible 3 such that surface 10b of seed substrate 10 is in contact with an upper face 3a of crucible 3 serving as a growth container. Crucible 3 is made of, for example, graphite. Further, in crucible 3, raw material powder 11 made of polycrystalline silicon carbide or the like is arranged in advance on a side of bottom face 3b. Accordingly, seed substrate 10 and raw material powder 11 are arranged to face each other in crucible 3 as shown in FIG. 8.

Next, as a step (S30), a temperature-raising step is performed. In this step (S30), after seed substrate 10 is arranged in crucible 3, a heater 4 is firstly operated to raise the temperature of crucible 3 to a predetermined temperature (for example, about 1500° C.) while reducing the pressure in crucible 3 through evacuation. Then, inactive gas such as argon (Ar) or the like is introduced, so that the temperature of crucible 3 is further raised to the crystal growth temperature (for example, the temperature of seed substrate 10 is 2250° C., and the temperature of raw material powder 11 is 2290° C.) while achieving a desired pressure (for example, 90 kPa) in crucible 3.

In this step (S30), when it is provided that a temperature at upper face 3a of crucible 3 is $T_1$, and a temperature at bottom face 3b facing upper face 3a is $T_2$, and a distance between upper face 3a and bottom face 3b in the direction from bottom face 3b toward upper face 3a is L, the temperature of crucible 3 is raised while maintaining a state with a value of $(T_2-T_1)/L$ smaller than 1. Further, it is preferable that after raising the temperature of crucible 3 to higher than or equal to 1700° C. the pressure in crucible 3 is maintained higher than or equal to 3 kPa. Temperatures $T_1$ and $T_2$ can be measured with use of a non-contact thermometer (pyrometer) through a measurement hole formed in a member such as a quartz tube or a heat insulator (not illustrated) arranged outside of crucible 3. An upper portion and a bottom portion of crucible 3 can be observed through the measurement hole. Further, the value of $(T_2-T_1)/L$ can be adjusted, for example, by changing a thickness of insulators arranged at an upper portion and a bottom portion of crucible 3 or changing a size of the measurement hole. Further, when crucible 3 is heated through resistive heating with use of a plurality of heaters 4 as in the present embodiment, the value can be adjusted by changing the temperature of each of the plurality of heaters 4. Further, when crucible 3 is heated through induction heating, the value can be adjusted by changing a positional relationship between an induction heating coil (not illustrated) and crucible 3.

Next, as a step (S40), a crystal growth step is performed. In this step (S40), firstly, the pressure in crucible 3 is reduced to a predetermined pressure (for example, 1 kPa). In this stage, the pressure in crucible 3 is preferably reduced at a rate of lower than or equal to 5 kPa/h. Accordingly, silicon carbide constituting raw material powder 11 is sublimated, and the sublimated silicon carbide is re-crystallized on surface 10a of seed substrate 10 (the other surface on a side opposite to surface 10b). Consequently, silicon carbide layer 12 made of single-crystal silicon carbide is grown on surface 10a, so that silicon carbide ingot 1 including seed substrate 10 and silicon carbide layer 12 is manufactured.

In this step (S40), a temperature gradient in a width direction viewed from a growth direction of silicon carbide layer 12 is preferably set less than or equal to 10° C./cm. Specifically, it is preferable that a heat insulating member (not illustrated) such as a carbon felt or a carbon-molded heat insulator is arranged at an upper portion of crucible 3 to reduce an amount of heat leakage from crucible 3 so that the temperature distribution in the radial direction of silicon carbide ingot 1 becomes uniform.

Further, in this step (S40), the temperatures at a central portion 31, an end portion 32, and an outermost peripheral portion 33 in silicon carbide ingot 1 are preferably set as follows. Herein, end portion 32 is a region defined at an end portion of silicon carbide ingot 1 and located at a distance within 10% of the diameter of silicon carbide ingot 1 from an inner wall of crucible 3. When it is provided that a temperature at central portion 31 is $T_3$, and a temperature at end portion 32 is $T_4$, and a temperature at outermost peripheral portion 33 is $T_5$, it is preferable that the relationship of $T_5>T_4 \geq T_3$ is satisfied, and that in relation to $T_4$ and $T_3$, and the relationship in which the temperature gradient ((an absolute value of a difference between $T_3$ and $T_4$)/(a distance between central portion 31 and end portion 32)) is less than or equal to 10° C./cm are satisfied.

In this case, it is necessary to have a uniform temperature distribution on a side of surface 10b of seed substrate 10'. Specifically, a configuration can be employed in which a heat insulating member (not illustrated) is arranged at an upper portion of crucible 3 to suppress a local diffusion of heat from crucible 3 and uniformly diffuse heat from crucible 3. Accordingly, a curvature radius between central portion 31 and end portion 32 on surface 12a of silicon carbide ingot 1 can be set larger than or equal to a threefold of a radius of silicon carbide ingot 1. In this case, the curvature radius is calculated, for example, as follows. Firstly, a height of silicon carbide ingot 1 (a distance from surface 10a of seed substrate 10 to surface 12a of silicon carbide ingot 1) is measured at a 5 mm pitch between central portion 31 and end portion 32. Then, a radius of an arc corresponding to surface 12a of silicon carbide ingot 1 between pitches is calculated based on a height difference of silicon carbide ingot 1 between pitches. Then, a minimum radius among radii of arcs calculated for the pitches between central portion 31 and end portion 32 is set as a curvature radius.

Further, as to the relationship between $T_5$ and $T_4$, an absolute value of a difference between $T_5$ and $T_4$ is preferably greater than or equal to 1° C. and less than or equal to 10° C., more preferably less than or equal to 5° C. (for example, $T_5$ is higher in temperature than $T_4$, and a difference between $T_4$ and $T_5$ is less than or equal to 10° C., more preferably less than or equal to 5° C.). Herein, when the absolute value of the difference is less than 1° C., polycrystalline of silicon carbide readily adheres to and grows on an inner wall face of crucible 3 made of graphite to thereby hamper the crystal growth of silicon carbide. Further, when the difference is greater than 10° C., an influence of radiation heat from crucible 3 also raises the temperature of end portion 32 of silicon carbide ingot 1. Consequently, the temperature difference between central portion 31 and end portion 32 becomes greater.

Next, as a step (S50), a post-processing step is performed. In this step (S50), formed silicon carbide ingot 1 is taken out from crucible 3, and a surface layer is abraded. Further, a mark indicating a crystal orientation is formed on silicon carbide ingot 1. The steps (S10) to (S50) are performed as described above to manufacture silicon carbide ingot 1, and then the method for manufacturing the silicon carbide ingot according to the present embodiment is completed.

Figure 6:
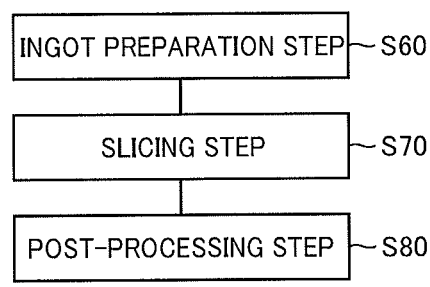
FIG. 6 is a flowchart schematically representing a method for manufacturing a silicon carbide substrate.

Next, a method for manufacturing a silicon carbide substrate according the present embodiment will be described. Referring to FIG. 6, according to the method for manufacturing a silicon carbide substrate, an ingot preparation step is performed as a step (S60). In this step (S60), the method for manufacturing a silicon carbide ingot according to the embodiment described is performed to prepare silicon carbide ingot 1 (FIGS. 1 and 2).

Next, as a step (S70), a slicing step is performed. In this step (S70), silicon carbide ingot 1 is sliced through a predetermined method to obtain silicon carbide substrate 2 (FIG. 3). As a method for slicing silicon carbide ingot 1, for example, a method of using a wire saw and a method of using a cutting member (for example, an inner peripheral blade) having hard abrasive grains such as diamond arranged on a surface can be employed. The direction of slicing silicon carbide ingot 1 is not particularly limited, and it may be, for example, the direction along surface 10a of seed substrate 10, or may be the direction along a flat plane defined by an off angle orientation of seed substrate 10 and a perpendicular line with respect to surface 10a of seed substrate 10.

Next, as a step (S80), a post-processing step (S80) is performed. In this step (S80), a main surface of silicon carbide substrate 2 obtained by slicing silicon carbide ingot 1 is abraded and polished to apply finish processing to have a mirror state or a predetermined surface state. The steps (S60) to (S80) described above are performed to manufacture silicon carbide substrate 2, and the method for manufacturing a silicon carbide substrate according to the present invention is completed.

As described above, in the method for manufacturing a silicon carbide ingot according to the present embodiment, after seed substrate 10 is arranged in crucible 3, the temperature of crucible 3 is raised in the state where the temperature distribution is uniform in the direction from bottom face 3b toward upper face 3a. Accordingly, a thermal stress exerted to surface 10a of seed substrate 10 is reduced, so that occurrence of a defect in silicon carbide layer 12 which grows on surface 10a can be suppressed. Consequently, occurrence of crossing patterns 20 (FIG. 2) formed by crossing straight lines extending along the <11-20> direction on surface 12a of silicon carbide layer 12 can be suppressed. Thus, with the method for manufacturing a silicon carbide ingot according to the present embodiment, occurrence of crossing patterns 20 is suppressed, so that silicon carbide ingot 1 capable of improving a yield of a semiconductor device having silicon carbide as constituent material can be manufactured.

Further, as described above, in the method for manufacturing a silicon carbide ingot according to the present embodiment, seed substrate 10 having a micropipe density (MPD) of less than or equal to $10/cm^2$ is prepared in step (S10). Accordingly, occurrence of the threading dislocation which causes occurrence of crossing patterns 20 in silicon carbide layer 12 can be suppressed. Consequently, occurrence of crossing patterns 20 on surface 12a of silicon carbide layer 12 can be suppressed more effectively.

Further, as described above, in the method for manufacturing a silicon carbide ingot according to the present embodiment, the temperature gradient in the width direction viewed from the growth direction of silicon carbide layer 12 may be set less than or equal to 10° C./cm in step (S40). By setting the temperature distribution in the growth plane (plane on a side opposite to the side of seed substrate 10) of silicon carbide layer 12 to be uniform as described above, occurrence of a defect threading in the growth direction in silicon carbide layer 12 can be suppressed. Consequently, occurrence of crossing patterns 20 on surface 12a of silicon carbide layer 12 can be suppressed more effectively.

Further, in the method for manufacturing a silicon carbide substrate according to the present embodiment, as described above, silicon carbide ingot 1 manufactured by the method for manufacturing a silicon carbide ingot according to the present embodiment is prepared. Therefore, in silicon carbide substrate 2 obtained by slicing silicon carbide ingot 1, occurrence of crossing patterns 20 on main surface 2a is suppressed. Thus, with the method for manufacturing a silicon carbide substrate according to the present embodiment, silicon carbide substrate 2 capable of improving a yield of a semiconductor device having silicon carbide as constituent material can be manufactured.

The silicon carbide substrate, the silicon carbide ingot, and the methods for manufacturing the silicon carbide substrate and the silicon carbide ingot according to the present invention may be particularly advantageously used for a silicon carbide substrate, a silicon carbide ingot, and methods for manufacturing the silicon carbide substrate and the silicon carbide ingot which are required to improve a yield of a semiconductor device having silicon carbide as constituent material.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide substrate comprising:
  a plurality of patterns observable by X-ray topography, each pattern comprising a plurality of straight lines that intersect each other and extend along the <11-20> direction, and the patterns not being present on one main surface which is substantially the {0001} surface.

2. A silicon carbide ingot comprising:
  a plurality of patterns each comprising a plurality of straight lines that intersect each other and extend along the <11-20> direction the patterns not being present on one main surface which is substantially the {0001} surface.

3. The silicon carbide ingot according to claim 2, wherein a polytype is 4H.

4. A silicon carbide substrate which is obtained by slicing the silicon carbide ingot according to claim 2, wherein
  patterns formed by crossing straight lines extending along the <11-20> direction and being observable by means of an X-ray topography are not present on one main surface.

* * * * *